United States Patent
Paruthi et al.

(10) Patent No.: US 8,397,189 B2
(45) Date of Patent: Mar. 12, 2013

(54) MODEL CHECKING IN STATE TRANSITION MACHINE VERIFICATION

(75) Inventors: Viresh Paruthi, Austin, TX (US); Peter Anthony Sandon, Vermont, VT (US); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/097,193

(22) Filed: Apr. 29, 2011

(65) Prior Publication Data
US 2012/0278774 A1 Nov. 1, 2012

(51) Int. Cl.
*G06F 9/455* (2006.01)
(52) U.S. Cl. ......................... 716/106; 716/111; 716/136
(58) Field of Classification Search ................. 716/106, 716/111, 136
See application file for complete search history.

(56) References Cited

U.S. PATENT DOCUMENTS

| | | | |
|---|---|---|---|
| 7,340,702 B2 | 3/2008 | Wang | |
| 2003/0225552 A1* | 12/2003 | Ganai et al. | 703/2 |
| 2004/0230407 A1* | 11/2004 | Gupta et al. | 703/2 |
| 2011/0093824 A1* | 4/2011 | Baumgartner et al. | 716/106 |

OTHER PUBLICATIONS

Xu et al., "Combination of Model Checking and Theorem Proving to Develop and Verify Embedded Software", Information Technology Journal 7 (4): 623-630, 2008.
Jian-Yu et al., "Combination of model checking and theorem proving to verify embedded software", Journal of China Universities of Posts and Telecommunications, vol. 12, No. 4, p. 80-4, 87, Dec. 2005.
Chakrabarti et al., "Mechanical Identification of Inductive Properties during Verification of Finite State Machines", Proceedings of the Seventh International Conference on VLSI Design, 1994, pp. 389-394.
Moura et al., "Lazy theorem proving for bounded model checking over infinite domains", Automated Deduction—CADE-18. 18th International Conference on Automated Deduction. Proceedings (Lecture Notes in Artificial Intelligence vol. 2392), Inclusive Page Nos. 438-455, Jul. 27-30, 2002.
Bo Guo, "Formal change impact analysis of extended finite state machines using a theorem prover", M.S., University of Nebraska at Omaha, 2008, 97 pages; AAT 1457780.
Yatin Vasant Hoskote, "Formal Techniques for Verification of Synchronous Sequential Circuits", Ph.D., The University of Texas at Austin, 1995, 172 pages; AAT 9617252, vol. 57/02-B of Dissertation Abstracts International. p. 1312.

* cited by examiner

*Primary Examiner* — Thuan Do
*Assistant Examiner* — Mohammed Alam
(74) *Attorney, Agent, or Firm* — Garg Law Firm, PLLC; Rakesh Garg; Libby Z. Toub (57) ABSTRACT

A method, system, and computer program product for improved model checking for verification of a state transition machine (STM) are provided. A hardware design under test and a property to be verified are received. A level (k) of induction proof needed for the verification is determined. A circuit representation of the property using the hardware design under test for k base cases is configured for checking that the circuit representation holds true for the property for each of the k base cases, and for testing an induction without hypothesis by testing whether the property holds true after k clock cycles starting from a randomized state, where induction without hypothesis is performed by omitting a test whether the property holds true for the next cycle after the property holds for k successive cycles. The induction proof of the property using the hardware design under test by induction without hypothesis is produced.

20 Claims, 6 Drawing Sheets

MODEL CHECKING IN STATE TRANSITION MACHINE VERIFICATION

RELATED APPLICATION

The present invention is related to similar subject matter of co-pending and commonly assigned U.S. patent application Ser. No. 13/097,171 entitled "VERIFYING DATA INTENSIVE STATE TRANSITION MACHINES" filed on Apr. 29, 2011, which is hereby incorporated by reference.

BACKGROUND

1. Technical Field

The present invention relates generally to a method, system, and computer program product for creating electronic circuits. More particularly, the present invention relates to a method, system, and computer program product for improved model checking in the verification of a hardware design implementing a state transition machine.

2. Description of the Related Art

Electronic circuits can be configured to perform mathematical computations. For example, a logic circuit in a microprocessor's integrated circuit may be configured to multiply two integers by manipulating their binary representation in a series of steps according to an algorithm.

Before the circuit can be designed for performing a computation, the series of steps according to a corresponding algorithm are represented in the form of a state transition machine (STM). A state transition machine is also known as a finite state machine, a finite state automaton, or simply a state machine.

A STM includes a set of states. A transition from one state to another state is called a state transition, and occurs in the STM when certain conditions are met. A state can receive an input, and produce an output. The output of one state may be an input for another state. Conditions that exist before a state transition are called pre-conditions. Conditions that exist after a state transition occurs are called post-conditions. For example, an input and pre-conditions trigger the operation of a STM, which performs state transitions according to the conditions configured in the STM, and produces an output and post-conditions.

Operating a STM is the process of supplying the STM an input and a set of pre-conditions, performing state transitions of the STM, and generating an output and post-conditions. Depending on the conditions programmed for the various state transitions, operating a STM can take a significant amount of time. A STM taking several seconds, typically a billion machine cycles or more, to generate an output is not uncommon.

The operation of a STM can be further affected by the size of data used in the operation. For example, where a STM may perform a computation using sixty four bit inputs in a matter of nano-seconds, the same STM may take many seconds to perform the same operation using eight thousand bit inputs.

SUMMARY

The illustrative embodiments provide a method, system, and computer program product for improved model checking in the verification of a data intensive state transition machine. An embodiment receives a hardware design under test and a property to be verified. The embodiment determines a level (k) of induction proof needed for the verification. The embodiment configures a circuit representation of the property using the hardware design under test for k base cases, for checking that the circuit representation holds true for the property for each of the k base cases. The embodiment further configures the circuit representation for testing an induction without hypothesis by testing whether the property holds true after k clock cycles starting from a randomized state, where the induction without hypothesis is performed by omitting a test whether the property holds true for the next cycle after the property holds for k successive cycles. The embodiment produces the induction proof of the property using the hardware design under test implementing the state transition machine by induction without hypothesis.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

In order to guarantee the hardware design under test (DUT), the DUT has to be verified for correct operation under the desired circumstances. For example, a DUT may implement an STM, and it may have to be verified that the DUT behaves as specified by the STM model for all possible input and pre-conditions. Verifying the correctness or accuracy of the operation of a given hardware design under all possible inputs, pre-conditions, and post-conditions is called the verification problem.

A model checker tests a model of a given system for conformity with a given specification. In other words, a model checker programmatically determines whether the given specification is satisfied by the given system. The model of a system is a representation of the system, such as a hardware implementation of an STM. The model and the specification are provided to the model checker in a language recognized by the model checker.

In an induction method of proof, one proves that a property is valid for an initial value, known as the base case, usually for n=0. Then the induction method shows that if the property is valid for an arbitrary value n, then the property is also valid for the next value n+1. Thereby, the induction proof proves that the property is valid for all values. Showing that the property is valid for n+1 is called the induction step. The assumed condition the property holds for the arbitrary value n is called the induction hypothesis.

In mathematical notation, an induction method is proving a Q(n) for arbitrary n using the following rule.

$$Q(0) \& \forall n \cdot (Q(N) => Q(n+1)) => \forall n \cdot Q(n)$$

In this notation, Q(0) is the base case and $\forall n.(Q(n)=>Q(n+1))$ is the induction step. Q(n) in the induction step is the induction hypothesis.

K-induction is an extension of the standard induction. It proves a property by first checking the validity of the property for k base cases where n=0, 1, ..., k. Then the k-induction method proves that, if the property holds for n, n+1, n+k−1, then it holds for n+k. Thereby, the k-induction method proves the property holds for arbitrary value n. There are k base case conditions to be checked for the k-induction method. Additionally, k induction hypotheses are assumed during the induction step.

In mathematical notation, the k-induction method proves a property Q(n) for arbitrary n using the following rule:

$$Q(0) \& \ldots \& Q(k-1) \& \forall n \cdot (Q(n) \& \ldots \& Q(n+k-1) => Q(n+k)) => \forall n \cdot Q(n)$$

There are k base cases Q(0), ..., Q(k−1). There are also k induction hypotheses Q(n), ..., Q(n+k−1).

An embodiment described elsewhere in the disclosure uses an induction method of proof in the model checker to verify (prove) a property for a state transition of a STM. The invention recognizes that for model checking using induction, the logic implementation of the induction proof of the properties has to include logic representing an induction hypothesis. In other words, this additional logic representing an induction hypothesis increases the state space searched by the model checker, and it significantly slows down the verification process.

The invention recognizes that it is desirable that the verification of a state transition of an STM involving n clock cycles uses the k-induction method where k is no less than n. The invention recognizes that the induction hypothesis logic that must be implemented for the k-induction method of proof increases in complexity for increasing value of k, thereby, slowing down the verification process.

The illustrative embodiments used to describe the invention generally address and solve the above-described problems and other problems related to verifying STMs. The illustrative embodiments provide a method, system, and computer program product for improved model checking in verification of STMs. An embodiment provides an improved model checker that can be combined with a theorem prover for performing verification of STMs.

An embodiment may be used in conjunction with any operation or computation in a similar manner within the scope of the invention. For example, one of ordinary skill in the art will be able to adapt an embodiment to test a STM for a multiplier. This and other such adaptations are contemplated within the scope of the invention.

The illustrative embodiments are described with respect to certain ICs or circuits only as examples. Such descriptions are not intended to be limiting on the invention. For example, an illustrative embodiment described with respect to a microprocessor can be implemented with respect to a logic circuit without departing the scope of the invention.

The illustrative embodiments are described with respect to certain data, data structures, file-systems, file names, directories, and paths only as examples. Such descriptions are not intended to be limiting on the invention. For example, an illustrative embodiment when described with respect to a table and path can be implemented as a flat file, an index file, or a database within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, parameters, considerations, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 1:
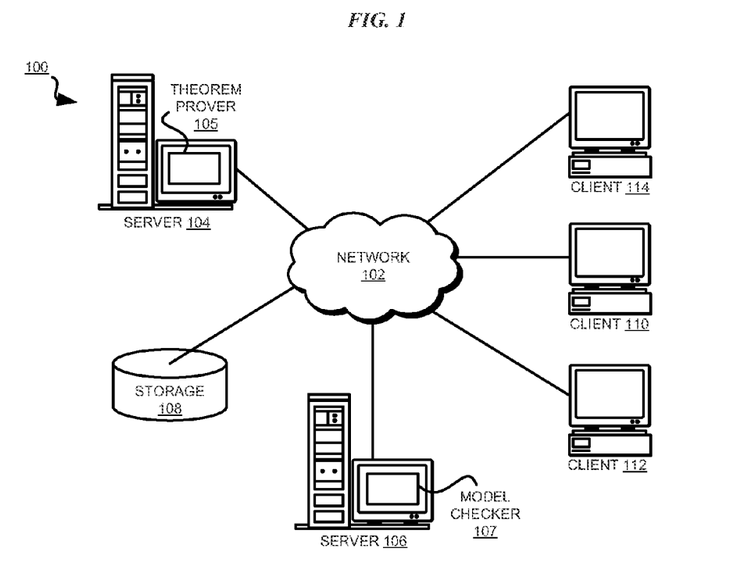
FIG. 1 depicts a pictorial representation of a network of data processing systems in which illustrative embodiments may be implemented.
Figure 2:
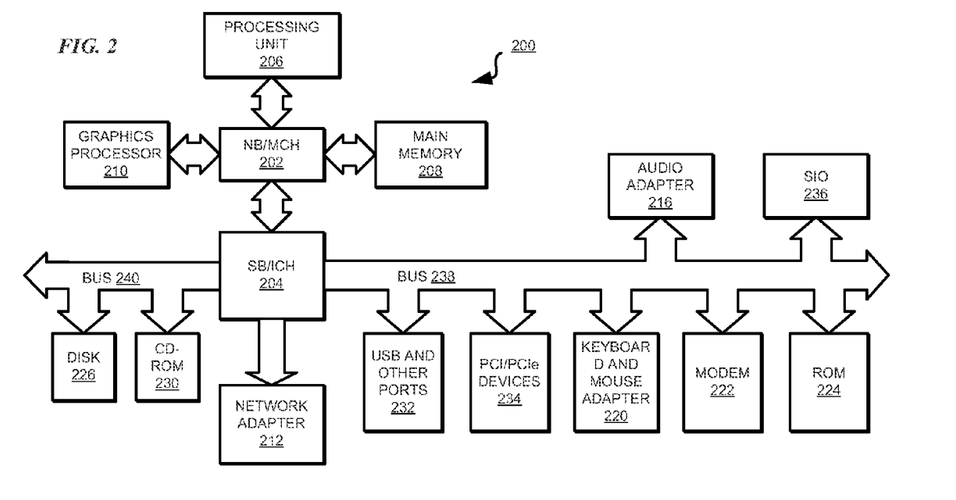
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Any data processing system, such as server 104, may include theorem prover 105. Model checker 107 may execute in server 106 or elsewhere in data processing environment 100, such that theorem prover 105 can interact with model checker 107 in the manner of an illustrative embodiment. In an embodiment, theorem prover 105 and model checker 107 may execute in a common data processing system, such as server 104.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

An embodiment described elsewhere in the disclosure describes an induction method for verifying a STM. In that embodiment, an example STM that transits from state $S_0$ to $S_1$, $S_2$ and so on, is described to take A cycles to transition from state $S_1$ to $S_{i+1}$.

For an example verification that a property $P_0$ holds for $S_0$, $P_1$ holds for $S_1$, $P_2$ holds for $S_2$, and so on, the expression $P_i(S_i)$ indicates that property $P_i$ holds for state $S_i$. Such properties are often represented as a combinational circuit with registers.

The embodiment uses a model checker to verify that, if a property holds for the starting state in a segment of the STM, whether another property holds for the finishing state. For example, the embodiment verifies in the model checker whether implications $(P_0(S_0) \Rightarrow P_1(S_1))$, $(P_1(S_1) \Rightarrow P_2(S_2))$, and so on are true. The embodiment reduces the verification problem to be solved to proving $P_i(S_i) \Rightarrow P_{i+1}(S_{i+1})$ by using the induction method of proof.

The notation $P_i(n)$ indicates that $P_i(S_i)$ holds at machine cycle n. If the transition from $S_i$ to $S_{i+1}$ takes $\Delta$ cycles, the implication that the embodiment is trying to prove can be written as $(P_i(n) \Rightarrow P_{i+1}(n+\Delta))$. The embodiment attempts to prove that this implication is valid for arbitrary clock cycle n.

Notation $Q(n)$ represents $(P_i(n) \Rightarrow P_{i+1}(n+\Delta))$. The embodiment proves $Q(n)$ by converting $Q(n)$ to a circuit using logical gates and latches. Since $P(n)$ is represented as a combinational circuit, we can latch the value of $P(n)$ for the $\Delta$ cycles that are needed for the state transition, and then check the latched value of $P(n)$ implies $P(n+\Delta)$.

The embodiment simplifies $Q(n)$ using a number of circuit reduction techniques, such as constant propagation, SAT sweeping, retiming, and transient value elimination. This reduction may reduce $Q(n)$ to 1, in such a case $Q(n)$ is proven to be correct, and the proof according to the embodiment stops. Otherwise, the embodiment proceeds to the next step. The embodiment proves $Q(n)$ by induction over clock cycle n. This step is done by proving the base case $Q(0)$ and the induction step $Q(n) \Rightarrow Q(n+1)$.

The embodiment is described as being configurable for using an extended format of induction, e.g., k-induction. Using k-induction, the embodiment proves $Q(n)$ by proving k base cases $Q(0), Q(1), \ldots Q(k-1)$, and also proving the induction step $Q(n) \& Q(n+1) \& \ldots \& Q(n+k-1) \Rightarrow Q(n+k)$. When the embodiment is configured for using k-induction, the embodiment relies on the logic that implements the induction hypothesis for the k-induction steps.

A more desirable embodiment according to the invention is described herein that implements an "induction without hypothesis" method of proof. The induction without hypothesis method may be implemented in a model checker to form an improved model checker according to an embodiment.

The "induction without hypothesis" method of proof is extensible to "k-induction without hypothesis" and greatly simplifies the logic implementation at the model checker. Such an embodiment reduces the complexity of the circuit used for the verification. Such an embodiment also performs the verification more efficiently because the improved model checker takes smaller amount of time, to wit, fewer cycles, to generate the induction proof.

Figure 3A:
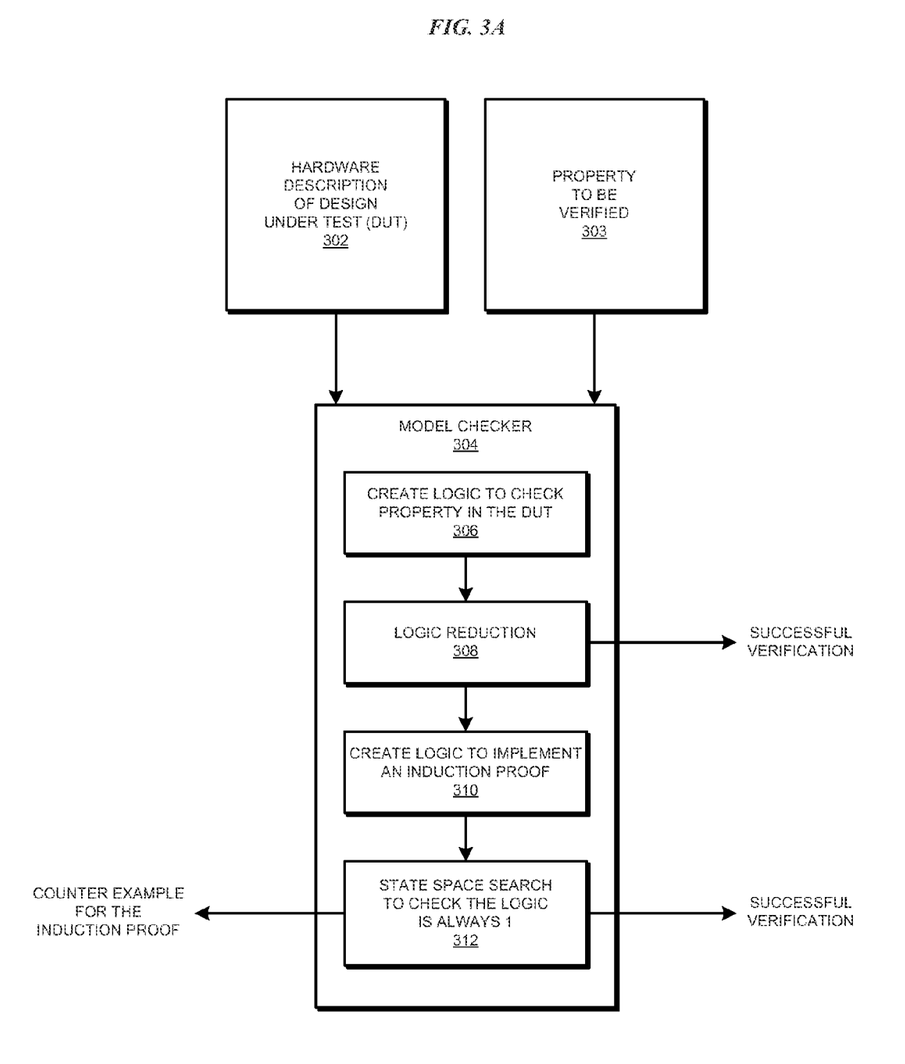
FIG. 3A depicts a block diagram of a process of verification of hardware implementing an STM that can be improved by an illustrative embodiment.

With reference to FIG. 3A, this figure depicts a block diagram of a process of verification of hardware implementing an STM that can be improved by an illustrative embodiment. Hardware description of a design under test (DUT) 302 and may be the hardware description in a hardware description language, such as VHDL or Verilog. Property to verified 303 may be a condition described in a hardware description language, a language specific to the model checker 304, or in a data-structure stored in a memory. Model checker 304 may be implemented using model checker 107 in FIG. 1.

As described above, model checker 304 creates 306 the logic to check property 303 for DUT 302. Then, model checker 304 performs logic reduction 308 to the resulting logic produced in block 306. If the logic is reduced to a value 1, the verification is successful. If not, model checker 304 further creates 310 the logic to implement an induction proof of the property 303 on hardware description 302. Model checker 304 performs 312 a state space search on the logic generated at 310. If the logic generated at block 310 always produces value 1, model checker 304 successfully verified property 303 on DUT 302. If not, model checker 304 can generate a counter example for the induction proof. The counter example may be generated as a form of waveform showing the case where DUT 302 violates property 303.

Figure 3B:
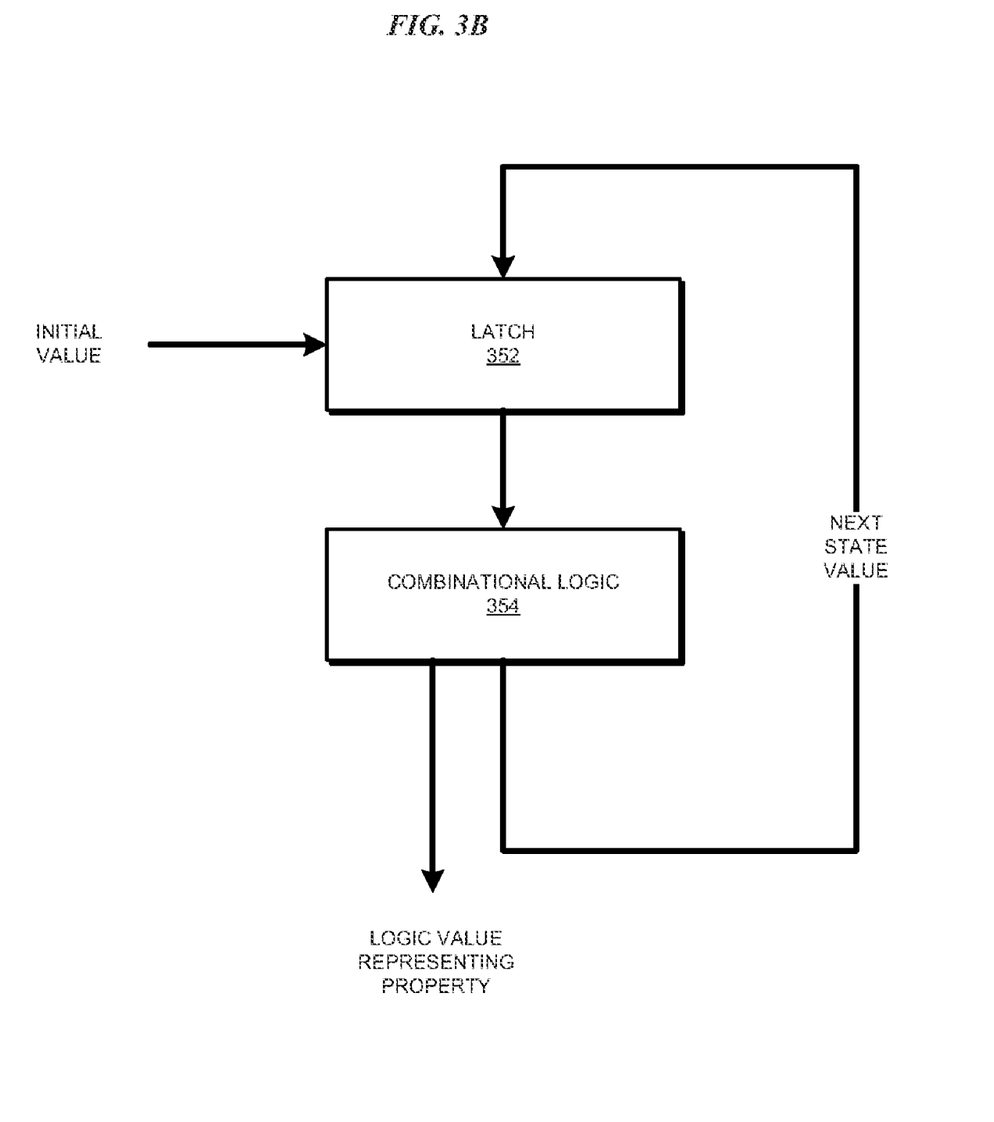
FIG. 3B depicts an example of the logic to check a property on a hardware design under test in accordance with an illustrative embodiment.

With reference to FIG. 3B, this figure depicts an example of the logic to check a property on a DUT in accordance with an illustrative embodiment. The property being checked may be property 303 in FIG. 3A, and the DUT may be DUT 302 in FIG. 3A.

The logic depicted in FIG. 3B may be created in the step 306 and reduced in step 308 of FIG. 3A. The logic to check the property is depicted as a sequential machine comprising latch 352 and combinational logic 354. Combinational logic 354 takes the output of latch 352 as an input. Combinational logic 354 outputs the next state value of the sequential machine and the logic value to represent the property. Latch 352 stores the next state value from combinational logic 354 and outputs the stored next state value one clock cycle later. An initial value is stored in latch 352 at the beginning of the execution of the sequential machine. The verification problem is to check whether the logic value representing a property is always 1.

Figure 4:
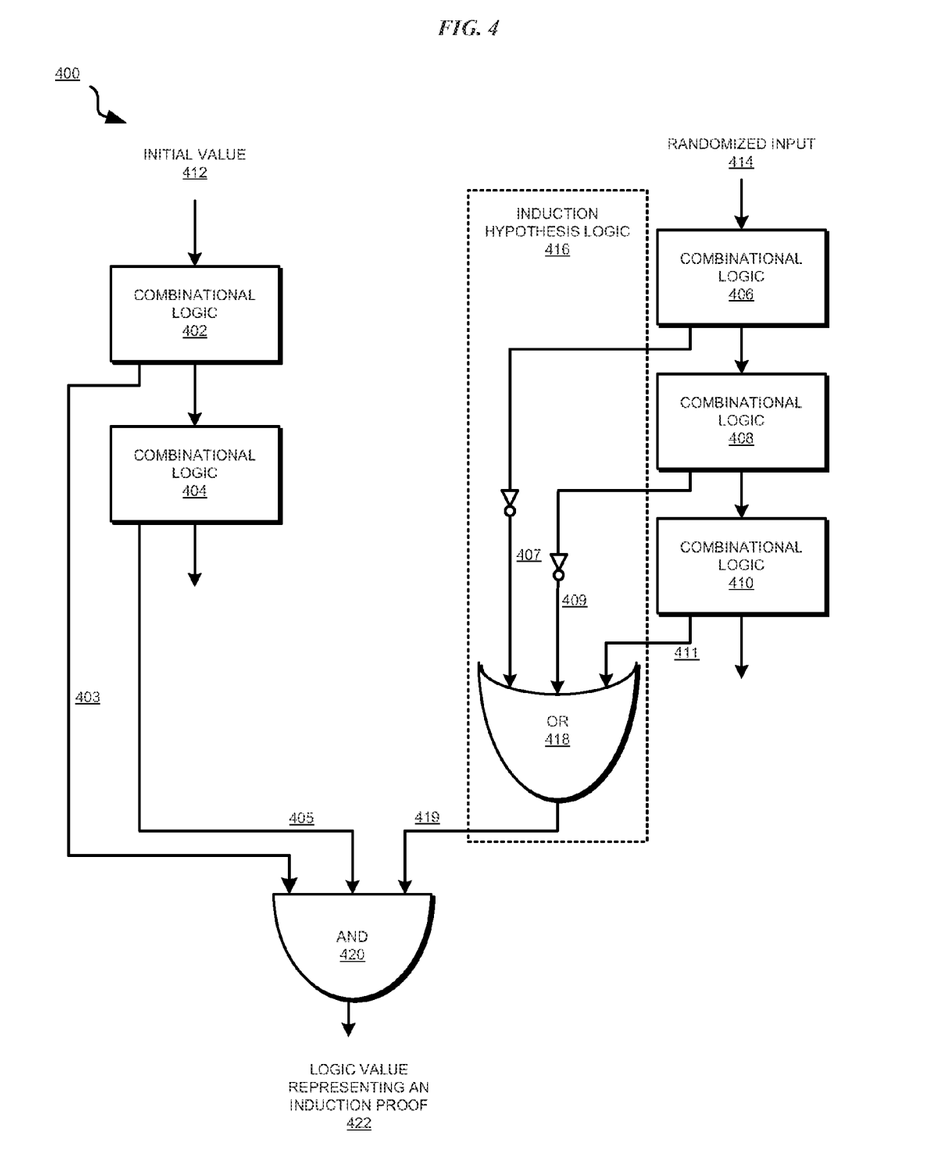
FIG. 4 depicts an example circuit diagram of a circuit for implementing the induction proof that may be improved by using an illustrative embodiment.

With reference to FIG. 4, this figure depicts an example circuit diagram of a circuit for implementing the induction proof that may be improved by using an illustrative embodiment. Circuit 400 may be created at step 310 in FIG. 3A and operated using model checker 304 in FIG. 3A. This example circuit depicts the circuit representation of k-induction where k=2. The circuit representation changes as the value of k increases or decreases.

Circuit 400 includes combinational logic blocks 402, 404, 406, 408, and 410. Combination logic in these blocks represents the reduced logic for property 303 on DUT 302 in FIG. 3A, and is depicted as combinational logic 354 in FIG. 3B. Blocks 402 and 404 compute the base cases for n=0, 1. Blocks 406-410 calculate the induction step for example case of k=2 for a normal k-induction proof. Initial value 412 is provided to block 402 to check the property for a base case of n=0. This initial value is the initial value depicted in FIG. 3B. Wire 403 holds the property value for the clock cycle n=0. Block 404 checks the base case for n=1, and wire 405 holds the property value for the clock cycle n=1.

Input 414 is a randomized input value. Input 414 is provided to block 406 to generate a property value for cycle n. Block 408 generates the property value for cycle n+1, and block 410 for n+2.

Induction hypothesis logic 416 includes the inverted verification outputs of all the blocks except the last block used in the induction step, such as the inverted outputs of blocks 406 and 408 in the example depicted here. Wires 407 and 409 hold the inverted value of the outputs of blocks 406 and 408 respectively, and represent the induction hypothesis that the property holds for cycle n and n+1. Induction hypothesis logic 416 further includes the output of the last block used in the induction step, such as the output of block 410 in the example depicted here. Wire 411 holds the property value at cycle n+2. Induction hypothesis logic 416 further includes OR gate 418. Wire 419 holds the value of implication that, if the property holds for cycle n and n+1, then the property also holds for cycle n+2.

The value on wire 419 representing the induction step and the values on wires 403 and 405 representing the base cases, in the example depicted here, are provided to AND gate 420. If output 422 of AND gate 420 is always 1, the property in question is proven by the induction method. In other words, the logic 400 implements the induction proof of the property in question.

In an embodiment, k-induction without hypothesis involves proving the base case $Q(0), \ldots Q(k-1)$ and the induction step $Q(n+k)$ without the induction hypothesis. In a normal induction verification method, property $P(n)$ can be verified by checking the base case $P(0)$, that P holds for the initial state. Then the induction step $P(n) \Rightarrow P(n+1)$ can be verified by starting from any machine state satisfying $P(n)$ and then checking $P(n+1)$ holds one cycle later. In a normal k-induction verification method, base cases $P(0), \ldots P(k-1)$ are checked by using bounded model checking up to cycle $k-1$. Induction step $P(n)$ $P(n+k-1) \Rightarrow P(n+k)$ is proven by considering k cycle machine simulation starting from any state, assuming that the first k cycles satisfy $P(n) \ldots P(n+k-1)$, and then check $P(n+k)$ holds at the last $(k+1)^{th}$ cycle.

However, in an embodiment implementing induction without hypothesis, verifying state transition property $Q(n)=(P_i(n) \Rightarrow P_{i+1}(n+\Delta))$, is carried out in a novel way. First, base cases $Q(0), \ldots Q(k-1)$ are checked by $k+\Delta-1$ cycle bounded simulation, because $Q(k-1)=P_i(k-1) \Rightarrow P_{i+1}(k+\Delta-1)$, and the last term mentions the property at cycle $k+\Delta-1$.

Figure 5:
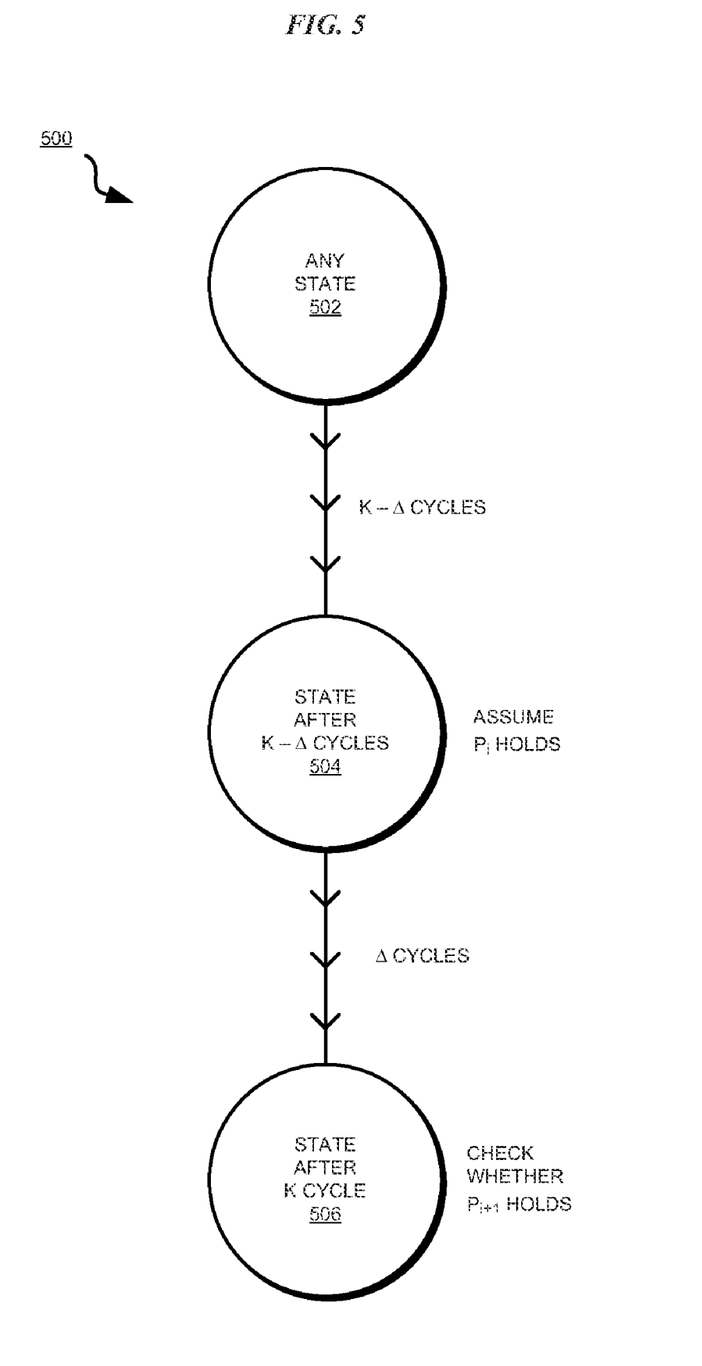
FIG. 5 depicts a block diagram of an induction step analysis in an induction without hypothesis method of verification of a STM in accordance with an illustrative embodiment.

Second, the induction step $Q(n) \& Q(n+1) \& \ldots \& Q(n+k-1) \Rightarrow Q(n+k)$ can be verified by checking the $n+k+\Delta$ cycle state transition starting from any state satisfying the induction hypotheses. However, the embodiment recognizes that hypotheses $Q(n), Q(n+1), \ldots$, and $Q(n+k-1)$ are not typically helpful for the verification for a state transition machine verification. Therefore, instead, the embodiment verifies $Q(n+k)=(P_i(n+k) \Rightarrow P_{i+1}(n+k+\Delta))$ without using the hypotheses by considering the sequence as depicted in FIG. 5.

In mathematical notation, the k-induction without hypothesis proves a property $Q(n)$ for arbitrary n using the following rule:

$$Q(0) \& Q(1) \& \ldots \& Q(k-1) \& \forall n \cdot Q(n+k) \Rightarrow \forall n \cdot Q(n)$$

$Q(0) \& Q(1) \& \ldots \& Q(k-1)$ check the k base cases. The induction step without induction hypothesis is given as $\forall n. Q(n+k)$.

With reference to FIG. 5, this figure depicts a block diagram of an induction step analysis in an induction without hypothesis method of verification of a STM in accordance with an illustrative embodiment. The example property to be verified is $P_i(n) \Rightarrow P_{i+1}(n+\Delta)$, an implication over a state transition which takes $\Delta$ clock cycles. Process 500 may be implemented in a model checker, such as model checker 304 in FIG. 3A.

State transition 500 is an example k state transition. Consider that the k state transition starts from a randomized state 502.

The embodiment assumes that machine state 504 after k-$\Delta$ cycle transition will hold $P_i$. The embodiment then checks whether machine state 506 after k cycles satisfies $P_{i+1}$.

Although no induction hypotheses are used in the embodiment, $P_{i+1}$ holds if $P_i$ is sufficiently strong. Proving that the base cases by bounded model checking for the initial $k+\Delta-1$, in combination with this induction step analysis is sufficient to guarantee that $Q(n)$ will be true for any value of n.

This analysis scheme according to the embodiment is the induction without hypothesis method of proof. Such an induction without hypothesis proof is a strong analytical tool particularly for verifying state transition machines for the reasons described above.

An example implementation used this technique of the embodiment for verifying many transitional properties found in data intensive STMs. The implementation allowed verification of the transitional properties that could not be verified using a standard induction or other model checking approaches. A modified model checking using the embodiment, combined with a theorem prover is a very powerful tool to verify complex STMs.

Figure 6:
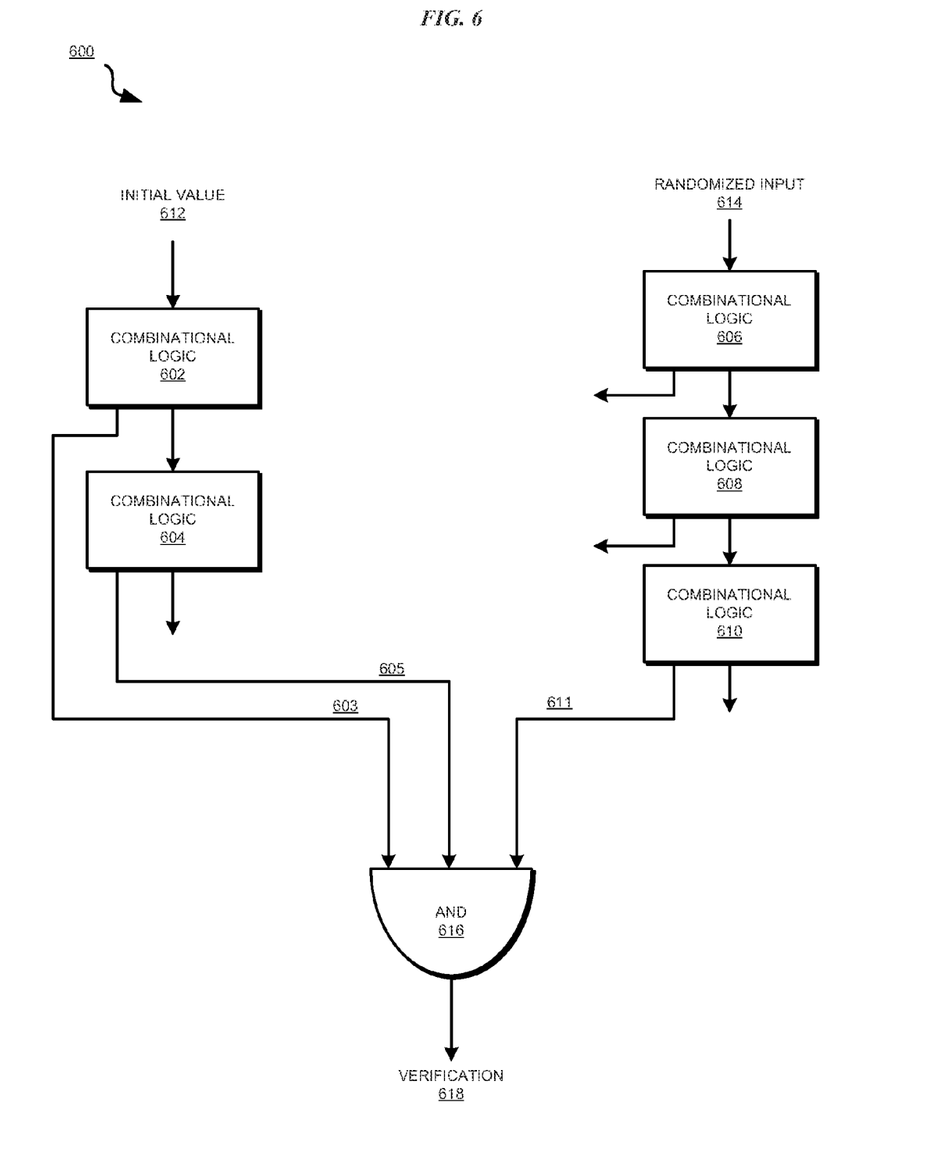
FIG. 6 depicts an example circuit diagram of a circuit for implementing an induction without hypothesis proof in accordance with an illustrative embodiment.

With reference to FIG. 6, this figure depicts an example circuit diagram of a circuit for implementing an induction without hypothesis proof in accordance with an illustrative embodiment. Circuit 600 may be created at step 310 and operated using an improvement of model checker 304 in FIG. 3A as described in an embodiment. This example circuit depicts the circuit representation of k-induction without hypothesis where k=2. The number of combinational blocks changes as the number k increases or decreases.

Circuit 600 includes combinational logic blocks 602, 604, 606, 608, and 610. The combination logic in these blocks represents the logic created at step 306 and reduced at step 308 in FIG. 3A. This combinational logic is the same as the combinational logic in FIG. 3B. Blocks 602 and 604 compute the property values for the base cases for n=0, 1. Blocks 606-610 compute the induction step in accordance with the induction without hypothesis method of k-induction proof of an embodiment. Initial value 612 is provided to block 602 to compute a base case of n=0. Block 604 computes the base case for n=1. Wires 603 and 605 hold the value of the property at clock cycle 0 and 1. Input 614 is a randomized input value.

Notice that no induction hypothesis logic analogous to induction hypothesis logic 416 of FIG. 4 is present or needed in circuit 600. Thus, circuit 600 is simplified over circuit 400 in FIG. 4, for a comparable level of verification. One of ordinary skill in the art will appreciate that this reduction in the complexity of circuit 600 is significant particularly for k-induction proofs with large k.

The output of induction step is generated from block 610 and provided to AND gate 616. Wire 611 holds the value of property at cycle n+2. The output of each base case block, to wit, the outputs of blocks 602 and 604 in the example depicted here, are also provided to AND gate 616. If output 618 of AND gate is always 1, the property in question is proven by induction without hypothesis. In other words, the logic circuit 600 implements the proof by induction without hypothesis of the property in question. Thus, model checker 304 in FIG. 3A can be modified according to an embodiment such that step 310 creates the logic representing the induction without hypothesis.

Usually, k-induction with higher values of k verifies more properties, but the induction without hypothesis method of proof according to an embodiment is especially effective with k-induction with high k values. This is due to the fact that, in a state transition proof of $P_i(n) \Rightarrow P_{i+1}(n+\Delta)$, k-induction without hypothesis with k<$\Delta$ fails because it does not cover $\Delta$ cycle state transition. Additionally, k-induction without hypothesis with high k values constrains the state $P_i(n)$ to the approximation of reachable states.

Preferably, the logic reduction step 308 should be performed prior to performing the induction without hypothesis, because it allows the induction to prove more properties. However, it is possible to apply induction without performing the logic reduction step.

For a yet stronger proof of $P_i(n) \Rightarrow P_{i+1}(n+\Delta)$, an embodiment may be modified to further write a machine invariant condition inv(n), prove that inv(n) is constantly held, and prove inv(n) & $P_i(n) \Rightarrow P_{i+1}(n)$ by the induction without hypothesis method, where the invariant inv(n) condition is augmenting the precondition Pi(n).

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for improved model checking in STM verification. Using an embodiment of the invention, a STM whose verification may be undesirably inefficient or not possible using a prior art model checker or software simulation can be verified efficiently. An embodiment enables verifying the properties over longer state transitions, more complex STMs, or a combination thereof, as compared to the presently available methods of STM verification.

Furthermore, the invention offers a new method, computer usable program product, and data processing system that combines improved model checking with theorem proving concepts to solve the problem of fast and simplified verification of STMs. The methodology of an embodiment performs the model checking using induction method of proof but without requiring the induction hypothesis related logic to be constructed.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer implemented method for improved model checking for verification of a state transition machine (STM), the method comprising:
   receiving a hardware design under test and a property to be verified;
   determining a level (k) of induction proof needed for the verification;
   configuring a circuit representation of the property using the hardware design under test for k base cases, for checking that the circuit representation holds true for the property for each of the k base cases;
   further configuring the circuit representation for testing an induction without hypothesis by testing whether the property holds true after k clock cycles starting from a randomized state, wherein the induction without hypothesis is performed, using a processor and a memory, by omitting a test whether the property holds true for the next cycle after the property holds for k successive cycles; and
   producing the induction proof of the property using the hardware design under test by induction without hypothesis.

2. The computer implemented method of claim 1, wherein the receiving, the determining, the configuring, the further configuring, and the producing are performed at a model checker, and wherein the omitting is a result of omitting a logic for induction hypothesis in the circuit representation.

3. The computer implemented method of claim 1, wherein configuring the circuit representation further comprises:
   performing a logic reduction to reduce a circuit corresponding to the property to a combinational logic circuit.

4. The computer implemented method of claim 1, wherein the property corresponds to a segment of the STM, further comprising:
   returning the proof to a theorem prover, wherein the theorem prover combines the result with other results for other properties of the STM and generates a verification of the STM.

5. The computer implemented method of claim 1, wherein the hardware definition is encoded in a memory.

6. The computer implemented method of claim 1, further comprising:
   testing whether the property holds for the k successive cycles starting from any state in the property.

7. The computer implemented method of claim 1, wherein the circuit is a logical simulation of a physical circuit.

8. The computer implemented method of claim 1, further comprising:
   producing a counter example for the induction proof when the induction proof fails.

9. The computer implemented method of claim 1, further comprising:
   writing a machine invariant condition; and
   proving that the machine invariant condition is constantly held, wherein producing the induction proof uses the machine invariant condition to augment a precondition.

10. A computer usable program product comprising a computer usable storage device including computer usable code for verification of a state transition machine (STM), the computer usable code comprising:
    computer usable code for receiving a hardware design under test and a property to be verified;
    computer usable code for determining a level (k) of induction proof needed for the verification;
    computer usable code for configuring a circuit representation of the property using the hardware design under test for k base cases, for checking that the circuit representation holds true for the property for each of the k base cases;
    computer usable code for further configuring the circuit representation for testing an induction without hypothesis by testing whether the property holds true after k clock cycles starting from a randomized state, wherein the induction without hypothesis is performed by omitting a test whether the property holds true for the next cycle after the property holds for k successive cycles; and
    computer usable code for producing the induction proof of the property using the hardware design under test by induction without hypothesis.

11. The computer usable program product of claim 10, wherein the receiving, the determining, the configuring, the further configuring, and the producing are performed at a model checker, and wherein the omitting is a result of omitting a logic for induction hypothesis in the circuit representation.

12. The computer usable program product of claim 10, wherein configuring the circuit representation further comprises:
    computer usable code for performing a logic reduction to reduce a circuit corresponding to the property to a combinational logic circuit.

13. The computer usable program product of claim 10, wherein the property corresponds to a segment of the STM, further comprising:
    computer usable code for returning the proof to a theorem prover, wherein the theorem prover combines the result with other results for other properties of the STM and generates a verification of the STM.

14. The computer usable program product of claim 10, wherein the hardware definition is encoded in a memory.

15. The computer usable program product of claim 10, further comprising:

computer usable code for testing whether the property holds for the k successive cycles starting from any state in the property.

16. The computer usable program product of claim 10, wherein the circuit is a logical simulation of a physical circuit.

17. The computer usable program product of claim 10, further comprising:

Computer usable code for producing a counter example for the induction proof when the induction proof fails instead of producing the induction proof.

18. The computer usable program product of claim 10, wherein the computer usable code is stored in a computer readable storage medium in a data processing system, and wherein the computer usable code is transferred over a network from a remote data processing system.

19. The computer usable program product of claim 10, wherein the computer usable code is stored in a computer readable storage medium in a server data processing system, and wherein the computer usable code is downloaded over a network to a remote data processing system for use in a computer readable storage medium associated with the remote data processing system.

20. A data processing system for verification of a state transition machine (STM), the data processing system comprising:

a storage device including a storage medium, wherein the storage device stores computer usable program code; and a processor, wherein the processor executes the computer usable program code, and wherein the computer usable program code comprises:

computer usable code for receiving a hardware design under test and a property to be verified;

computer usable code for determining a level (k) of induction proof needed for the verification;

computer usable code for configuring a circuit representation of the property using the hardware design under test for k base cases, for checking that the circuit representation holds true for the property for each of the k base cases;

computer usable code for further configuring the circuit representation for testing an induction without hypothesis by testing whether the property holds true after k clock cycles starting from a randomized state, wherein the induction without hypothesis is performed by omitting a test whether the property holds true for the next cycle after the property holds for k successive cycles; and computer usable code for producing the induction proof of the property using the hardware design under test by induction without hypothesis.

\* \* \* \* \*